(12) United States Patent
Unterreitmayer

(10) Patent No.: US 9,124,273 B2
(45) Date of Patent: Sep. 1, 2015

(54) SENSOR DEVICE AND METHOD FOR GRIP AND PROXIMITY DETECTION

(75) Inventor: Reinhard Unterreitmayer, Gauting (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 484 days.

(21) Appl. No.: 13/512,981

(22) PCT Filed: Dec. 3, 2010

(86) PCT No.: PCT/EP2010/068885
§ 371 (c)(1),
(2), (4) Date: Nov. 19, 2012

(87) PCT Pub. No.: WO2011/069926
PCT Pub. Date: Jun. 16, 2011

(65) Prior Publication Data
US 2013/0057299 A1    Mar. 7, 2013

(30) Foreign Application Priority Data
Dec. 11, 2009   (DE) .......................... 10 2009 057 933

(51) Int. Cl.
*G01R 27/26* (2006.01)
*G06F 3/045* (2006.01)
(Continued)

(52) U.S. Cl.
CPC ............ *H03K 17/955* (2013.01); *G01D 3/0365* (2013.01); *G01D 5/2405* (2013.01);
(Continued)

(58) Field of Classification Search
CPC .............. H03K 17/962; H03K 17/955; H03K 2017/9602; H03K 2217/96077; H03K 2217/960775; G01D 3/0365; G01D 5/2405

USPC ................. 324/683, 658, 649, 600, 629, 686; 345/173, 174
See application file for complete search history.

(56) References Cited

U.S. PATENT DOCUMENTS

2007/0075986 A1    4/2007   Chen ............................. 345/173
2011/0025345 A1*  2/2011   Unterreitmayer ............. 324/600
(Continued)

FOREIGN PATENT DOCUMENTS

DE    202008013083 U1    12/2008   ........... H03K 17/955
WO   2009/130165 A2    10/2009   ............... G06F 3/033

OTHER PUBLICATIONS

International PCT Search Report and Written Opinion, PCT/EP2010/068885, 12 pages, Jun. 30, 2011.
(Continued)

*Primary Examiner* — Hoai-An D Nguyen
(74) *Attorney, Agent, or Firm* — Slayden Grubert Beard PLLC

(57) ABSTRACT

A sensor device is provided, with a first electrode structure and a second electrode structure, wherein the first electrode structure has a transmitting electrode, a compensation electrode and a reception electrode and wherein the second electrode structure has a number of field sensing electrodes. The first and the second electrode structure are coupled with an evaluating device. The evaluating device has a signal generator for supplying the transmitting electrode and the compensation electrode with an alternating electrical signal. The reception electrode, the transmitting electrode, the compensation electrode and the field sensing electrodes are arranged in relation to each other in such a way that a first alternating electrical field emitted at the transmitting electrode may be coupled into the reception electrode and into one of the field sensing electrodes and a second alternating electrical field emitted at the compensation electrode may be coupled substantially only into the reception electrode.

34 Claims, 5 Drawing Sheets

(51) Int. Cl.
  *H03K 17/955* (2006.01)
  *G01D 3/036* (2006.01)
  *G01D 5/24* (2006.01)
  *H03K 17/96* (2006.01)

(52) U.S. Cl.
  CPC ...... *H03K17/962* (2013.01); *H03K 2017/9602* (2013.01); *H03K 2217/96077* (2013.01); *H03K 2217/960775* (2013.01)

(56) References Cited

U.S. PATENT DOCUMENTS

| | | | |
|---|---|---|---|
| 2012/0026121 A1* | 2/2012 | Unterreitmayer et al. | 345/174 |
| 2013/0176693 A1* | 7/2013 | Gute | 361/749 |
| 2013/0187705 A1* | 7/2013 | Kaltner et al. | 327/517 |
| 2014/0111222 A1* | 4/2014 | Aubauer et al. | 324/658 |
| 2014/0118011 A1* | 5/2014 | Burger et al. | 324/676 |
| 2014/0139240 A1* | 5/2014 | Burger | 324/658 |
| 2014/0191969 A1* | 7/2014 | Unterreitmayer et al. | 345/163 |
| 2014/0218054 A1* | 8/2014 | Steffens et al. | 324/660 |

OTHER PUBLICATIONS

Japanese Office Action, Application No. 2012-542478, 12 pages, Oct. 2, 2014.
Japanese Office Action, Application No. 2012-542478, 11 pages, Jun. 17, 2015.

* cited by examiner

SENSOR DEVICE AND METHOD FOR GRIP AND PROXIMITY DETECTION

CROSS-REFERENCE TO RELATED APPLICATIONS

This application is a U.S. National Stage Application of International Application No. PCT/EP2010/068885 filed Dec. 3, 2010, which designates the United States of America, and claims priority to German Application No. 10 2009 057 933.8 filed Dec. 11, 2009, the contents of which are hereby incorporated by reference in their entirety.

TECHNICAL FIELD

The present disclosure relates to a sensor device for detecting an approach and a grip of an electric device by an object. Moreover the present disclosure relates to a method for the detection of an approach and a touch of an electric device by a person. The electric device may be for example a mobile phone, a computer mouse, a remote control, an input means for a games console, a mobile mini computer (PDA), a headphone, a hearing aid, or the like.

BACKGROUND

Conventional devices are known, which may be arranged at a hand-held device, in order to detect an approach to the hand-held device by a hand. For example it is known to arrange capacitative sensors at a hand-held device, in order to get an effect based on a change of the dielectric properties in the area of the sensor electrodes upon an approach of a hand to the sensor electrode.

It is disadvantageous in this respect that it may not be clearly distinguished between an approach of a sensor electrode and a touch of the sensor electrode by the hand. Moreover it is disadvantageous that once the hand-held device is encompassed by a hand, so that the sensor device detects a change of the dielectric properties at the sensor electrode, it may not be longer determined by the sensor device whether for example a second hand approaches to the hand-held device or the hand-held device is touched.

SUMMARY

According to various embodiments, solutions can be provided which make it possible to reliably detect a touch or an encompassing for example of a hand-held device by a hand as well as at the same time also an approach to the hand-held device, for example by a second hand.

According to an embodiment, a sensor device may comprise at least one first electrode structure, wherein the first electrode structure comprises at least one transmitting electrode and at least one reception electrode, wherein the at least one reception electrode is capacitively coupleable with the at least one transmitting electrode, at least one second electrode structure, wherein the second electrode structure comprises at least one field sensing electrode, wherein the at least one field sensing electrode is capacitively coupleable with the at least one transmitting electrode of the at least one first electrode structure, and an evaluating device, which is coupled with the first electrode structure and the second electrode structure, wherein the transmitting electrode is supplyable with a first alternating electrical signal and wherein the evaluating device is configured to evaluate a first electrical signal tapped from the reception electrode and a second electrical signal tapped from the at least one field sensing electrode.

According to a further embodiment of the above device, the first electrode structure comprises at least one compensation electrode, wherein the at least one reception electrode is capacitively coupleable with the at least one compensation electrode, and wherein the at least one compensation electrode is supplyable with a second alternating electrical signal.

According to a further embodiment of the above device, the evaluating device comprises a signal generator device for providing the first alternating electrical signal and the second alternating electrical signal.

According to a further embodiment of the above device, the reception electrode, the transmitting electrode, the compensation electrode and the field sensing electrodes are arranged in relation to each other in such a way that a first alternating electrical field emitted by the transmitting electrode is coupleable into the reception electrode and into at least one of the field sensing electrodes, and a second alternating electrical field emitted by the compensation electrode is coupleable substantially only into the reception electrode.

According to a further embodiment of the above device, at least one of the field sensing electrodes is assigned to an auxiliary electrode, wherein the auxiliary electrode is galvanically or capacitively coupleable with the at least one field sensing electrode.

According to a further embodiment of the above device, a contact to the auxiliary electrode by an object, in case of a simultaneous approach of the object to the first electrode structure, leads to an abrupt change of the level of the second electric signal tapped from the field sensing electrode assigned to the auxiliary electrode.

According to a further embodiment of the above device, the device can be configured to tap a first electrical signal from the reception electrode and to evaluate its signal level, to tap a second electrical signal from the at least one field sensing electrode and to evaluate its signal level, wherein the results of the evaluation of the signal levels of the first electric signal and of the second electric signal being useable in order to transfer an electric hand-held device into a operating mode depending on the signal levels.

According to a further embodiment of the above device, the compensation electrode is arranged substantially between the transmitting electrode and the reception electrode.

According to a further embodiment of the above device, the electrodes can be arranged in relation to each other in such a way that the behaviour of the electric field lines among the electrodes is influenceable by a body.

According to a further embodiment of the above device, the electrodes of the first electrode structure are arranged in relation to each other in such a way that a body approaching to the electrodes of the first electrode structure bridges the second alternating electric field emitted at the compensation electrode, whereby the first alternating electric field emitted at the transmitting electrode is coupleable over the body into the reception electrode.

According to a further embodiment of the above device, the second electric signal is tappable in a multiplexing method, preferably in a time-division multiplexing method from the at least one field sensing electrode.

According to a further embodiment of the above device, the first alternating electrical signal and the second alternating electrical signal are dephased to each other.

According to a further embodiment of the above device, the amplitude of the first alternating electrical signal is greater than the amplitude of the second alternating electrical signal.

According to a further embodiment of the above device, the transmitting electrode and the reception electrode are arrangeable at a hand-held device in relation to each other in such a way that in case of an encompassing of the hand-held device by a hand they are at least partially covered by the same.

According to another embodiment, a sensor device may comprise at least one first electrode structure and at least one second electrode structure, wherein the first electrode structure comprises a transmitting electrode, a compensation electrode and a reception electrode and wherein the second electrode structure comprises a number of field sensing electrodes, and an evaluating device, which is coupled with the first electrode structure and the second electrode structure, wherein the evaluating device comprises a signal generator device for supplying the transmitting electrode with a first alternating electrical signal and for supplying the compensation electrode with a second alternating electrical signal, and wherein the evaluating device is configured to evaluate a first electrical signal tapped from the reception electrode and at least one second electrical signal tapped from the field sensing electrodes, wherein the reception electrode, the transmitting electrode, the compensation electrode and the field sensing electrodes being arranged in relation to each other in such a way that a first alternating electrical field emitted by the transmitting electrode being coupleable into the reception electrode and into at least one of the field sensing electrodes, and a second alternating electrical field emitted by the compensation electrode being coupleable substantially only into the reception electrode.

According to a further embodiment of the above device, the first alternating electrical signal and the second alternating electrical signal are dephased to each other.

According to a further embodiment of the above device, the amplitude of the first alternating electrical signal is greater than the amplitude of the second alternating electrical signal.

According to a further embodiment of the above device, an approach of an object to the first electrode structure leads to a change of a level of the first electric signal tapped from the reception electrode, wherein the change of the level is indicative for an approach of an object to the first electrode structure.

According to a further embodiment of the above device, an additional approach of the object to the second electrode structure leads to a change of a level of at least one second electric signal tapped from the field sensing electrodes, wherein the level change of the second electric signal is indicative for the fact that the object approaches to both the first electrode structure and the second electrode structure.

According to a further embodiment of the above device, an auxiliary electrode is assigned to at least one of the field sensing electrodes, the auxiliary electrode being galvanically or capacitively coupleable with the at least one field sensing electrode.

According to a further embodiment of the above device, a contact to the auxiliary electrode by an object, by a simultaneous approach of the object to the first electrode structure, leads to an abrupt change of the level of the second electric signal tapped from the field sensing electrode assigned to the auxiliary electrode.

According to a further embodiment of the above device, the transmitting electrode and the reception electrode being arrangeable at a hand-held device in relation to each other in such a way that in case of an encompassing of the hand-held device by a hand they are at least partially covered by the same.

According to a further embodiment of anyone of the above devices, the device is coupled with a sensor, which is not formed as a capacitive sensor, and wherein a sensor signal of the sensor is fed to the evaluating device. According to a further embodiment of anyone of the above devices, the sensor comprises an acceleration sensor.

According to yet another embodiment, a hand-held device may comprise any of the sensor devices as described above.

According to a further embodiment of the above hand-held device, the transmitting electrode and the reception electrode of the sensor device are arranged on the handheld device in such a way that in case of encompassing of the hand-held device by a hand they are at least partially covered by the hand. According to a further embodiment of the above hand-held device, the hand-held device comprises at least one of mobile phone, computer mouse, remote control, input means for a games console, mobile minicomputer, headphone, and hearing aid.

According to yet another embodiment, in a method for the detection of an encompassing of a hand-held device by a user in case of a simultaneous detection of an approach of the user to the hand-held device with a sensor device, which comprises at least one first electrode structure and at least one second electrode structure, wherein the first electrode structure comprises a transmitting electrode, a compensation electrode and a reception electrode and wherein the second electrode structure comprises a number of field sensing electrodes,—the transmitting electrode is supplied with a first alternating electrical signal and the compensation electrode is supplied with a second alternating electrical signal in such a way that a first alternating electrical field is emitted at the transmitting electrode, which is coupleable into the reception electrode and into at least one of the field sensing electrodes, and a second alternating electrical field is emitted at the compensation electrode, which is coupleable substantially only into the reception electrode,—a first electrical signal is tapped from the reception electrode and its signal level is evaluated, wherein the signal level of the first electric signal is indicative for the encompassing of the hand-held device by a user, and—a second electrical signal is tapped from at least one of the field sensing electrodes and its signal level is evaluated, wherein the signal level of the second electric signal is indicative for the approaching of the user to the hand-held device.

According to a further embodiment of the above method, the results of the evaluations of the signal level of the first electric signal and of the second electric signal are used in order to transfer the hand-held device into an operating mode depending on the signal levels.

BRIEF DESCRIPTION OF THE DRAWINGS

Further details and characteristics of various embodiments result from the following description in association with the drawing. The figures show.

DETAILED DESCRIPTION

Figure 1:
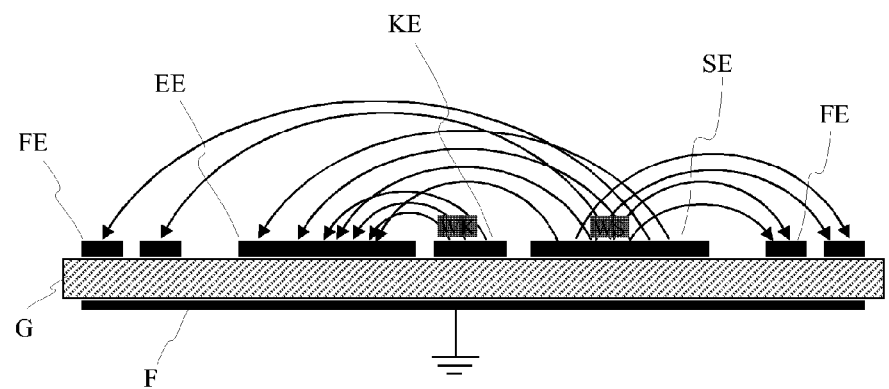
FIG. 1 an electrode arrangement according to various embodiments of a capacitive sensor device for clarification of the method according to various embodiments.

A sensor device is therefore provided, which comprises
at least one first electrode structure, wherein the first electrode structure comprises at least one transmitting electrode and at least one reception electrode, wherein the at least one reception electrode may be capacitively coupled with the at least one transmitting electrode,
at least one second electrode structure, wherein the second electrode structure comprises at least one field sensing electrode, wherein the at least one field sensing electrode may be capacitively coupled with the at least one transmitting electrode of the at least one first electrode structure, and
an evaluating device, which is coupled with the first electrode structure and the second electrode structure, wherein the transmitting electrode is supplyable with a first alternating electrical signal and wherein the evaluating device is adapted to evaluate a first electrical signal tapped from the reception electrode and a second electrical signal tapped from the at least one field sensing electrode.

It is thus possible in a particularly advantageous way, during the encompassing of for example an electric hand-held device by a hand, to simultaneously detect also an approach to the hand-held device, of for example a finger.

The first electrode structure may comprise at least one compensation electrode, wherein the at least one reception electrode may be capacitively coupled with the at least one compensation electrode, and wherein the at least one compensation electrode may be supplied with a second alternating electrical signal.

The evaluating device may comprise a signal generator device to provide the first alternating electrical signal and the second alternating electrical signal.

The reception electrode, the transmitting electrode, the compensation electrode and the field sensing electrodes may be arranged relatively to each other in such a way that
a first alternating electrical field emitted by the transmitting electrode may be coupled into the reception electrode and in at least one of the field sensing electrodes, and
a second alternating electrical field emitted by the compensation electrode may be coupled substantially only into the reception electrode.

Thus for example an encompassing of a hand-held device by a hand may be particularly clearly detected, without negatively influencing at the same time the detection of an additional approach to the hand-held device.

It has been found advantageous, that the compensation electrode is arranged substantially between the transmitting electrode and the reception electrode.

A sensor device is also provided, which comprises
at least one first electrode structure and at least one second electrode structure, wherein the first electrode structure comprises a transmitting electrode, a compensation electrode and a reception electrode and wherein the second electrode structure comprises a number of field sensing electrodes, and
an evaluating device, which is coupled with the first electrode structure and the second electrode structure, wherein the evaluating device comprises a signal generator device for supplying the transmitting electrode with a first alternating electrical signal and for supplying the compensation electrode with a second alternating electrical signal, and wherein the evaluating device is configured to evaluate a first electrical signal tapped from the reception electrode and at least one second electrical signal tapped from the field sensing electrodes,
wherein the reception electrode, the transmitting electrode, the compensation electrode and the field sensing electrodes are arranged relatively to each other in such a way that
a first alternating electrical field emitted by the transmitting electrode may be coupled into the reception electrode and into at least one of the field sensing electrodes, and
a second alternating electrical field emitted by the compensation electrode may be substantially only coupled into the reception electrode.

Thus two observation areas may be advantageously defined with a sensor device, so that e.g. on a mobile phone an encompassing of the mobile phone by a hand (with the first electrode structure) and at the same time also an approach to the mobile phone (with the second electrode structure), e.g. with the other hand, may be detected. The provision of several sensor devices is avoided, which considerably reduces the constructional effort. Moreover, by the provision of the second electrode structure, which is not influenced by the compensation electrode, the total supervised observation area is enlarged. Likewise it is advantageously avoided that an approach to the second electrode structure without a simultaneous approach to the transmitting electrode lead to an unintentional disengagement of an assigned function of the second electrode structure.

The first alternating electrical signal and the second alternating electrical signal may be dephased to each other.

The amplitude of the first alternating electrical signal is preferably greater than the amplitude of the second alternating electrical signal. Therefore a signal damping may be advantageously reached at the reception electrode.

An approach of an object to the first electrode structure may lead to a change of a level of the first electric signal tapped from the reception electrode, which is indicative for an approach of an object to the first electrode structure.

An additional approach to the second electrode structure of the object may lead to a change of a level of the at least one of the second electric signals tapped from the field sensing electrodes, wherein the level change of the second electric signal indicates that the object approaches to both the first electrode structure and the second electrode structure.

An auxiliary electrode may be assigned to at least one of the field sensing electrodes, wherein the auxiliary electrode may be galvanically or capacitively coupled with the at least one field sensing electrode. The sensitivity of the field sensing electrodes may be so considerably increased, which is advantageous, if the capacitative coupling between the transmission electrode and the respective field sensing electrode is small.

A touch of the auxiliary electrode by an object, simultaneously with an approach of the object to the first electrode structure, may lead to an abrupt change of the level of the second electric signal tapped from field sensing electrode assigned at the auxiliary electrode. Therefore a mechanical sensing device may be advantageously "simulated", because the user obtains a tactile response by the touch.

It is particularly advantageous that the transmitting electrode and the reception electrode are so arranged in relation to each other at a hand-held device, that in case of an encompass of the hand-held device by a hand they are at least partially covered. Thus it is guaranteed that the first electrode structure provides a signal only when the hand-held device is really encompassed by a hand.

Also provided by various embodiments is a method for the detection of an encompassing of a device or a hand-held device by a user in case of a simultaneous detection of an approach of the user to the device or to the hand-held device with a sensor device, which includes at least one first electrode structure and at least one second electrode structure, wherein the first electrode structure comprises a transmitting electrode, a compensation electrode and a reception electrode and wherein the second electrode structure comprises a number of field sensing electrodes, wherein the transmitting electrode is supplied with a first alternating electrical signal and the compensation electrode is supplied with a second alternating electrical signal, so that at the transmitting electrode a first alternating electrical field is emitted, which may be coupled into the reception electrode and in at least one of the field sensing electrodes, and at the compensation electrode a second alternating electrical field is emitted, which is substantially only coupled into the reception electrode, at the reception electrode a first electrical signal and its signal levels are evaluated, wherein the signal level of the first electric signal is indicative for the encompassing of the hand-held device by a user, and at least one of the field sensing electrodes a second electrical signal is emitted and its signal levels are evaluated, wherein the signal level of the second electric signal is indicative for the approach of the user to the hand-held device.

The results of the evaluations of the signal level of the first electric signal and of the second electric signal may be used to transfer the hand-held device into an operation mode depending on the signal levels.

Also provided by further embodiments is a hand-held device with a sensor device according to various embodiments. The hand-held device may be a mobile phone, a computer mouse, a remote control, an input means for a games console, a mobile minicomputer (PDA), a headphone, a hearing aid, or the like.

FIG. 1 exemplary shows the arrangement of the electrodes of a sensor device according to various embodiments on the surface of a case G, for example of a hand-held device. The electrodes arranged on the surface 0 are formed by two electrode structures.

The first electrode structure comprises a transmitting electrode SE, a compensation electrode KE and a reception electrode EE. The compensation electrode KE is arranged in the embodiment shown in FIG. 1 substantially between the transmitting electrode SE and the reception electrode EE.

The second electrode structure comprises here four field sensing electrodes FE. The field sensing electrodes FE are arranged relatively to the first electrode structure in such a way that an alternating electrical field WK emitted by the compensation electrode KE is substantially only coupled into the reception electrode EE, but not into the field sensing electrodes FE.

The reception electrode EE of the first electrode structure is connected to a signal input of an evaluating device or a control means. The transmitting electrode SE and the compensation electrode KE of the first electrode structure are supplied each time with an alternating electric quantity of particular frequency and amplitude. This alternating electric quantity is designated in the following as alternating signal or alternating electrical signal.

The alternating electrical signal supplied at the transmission electrode SE has a frequency of approximately between 50 kHz and 300 kHz. The alternating electrical signal supplied at the transmitting electrode SE preferably has a frequency between 75 kHz and 150 kHz.

The alternating electrical signal supplied at the compensation electrode KE preferably shows the waveform and the frequency of the alternating electrical signal, with which the transmitting electrode SE is supplied. The alternating electrical signal, with which the compensation electrode KE is supplied, is dephased with the alternating electrical signal of the transmitting electrode SE. The phase shift may be done with a phase shifter, which is arranged between a signal generator and the transmitting electrode or the compensation electrode (see FIG. 3).

The transmitting electrode SE as well as the alternating electrical signal supplied on the same is configured in such a way that the alternating electric field WS emitted by the transmitting electrode SE may be coupled into the reception electrode EE. The compensation electrode KE as well as the alternating electrical signal supplied at the same is configured in such a way that the alternating electric field WK emitted at the compensation electrode KE may be also coupled into the reception electrode EE. By the alternating electric field WK emitted at the compensation electrode KE, which is dephased to the electric alternating field WK emitted by the transmission electrode SE, the level of the alternating electric field acting at the reception electrode EE, which results from the electric alternating fields WS and WK, is reduced or erased in a superposition out of phase, i.e. in a phase shift of 180° (almost).

The electric alternating fields WK and WS coupled into the reception electrode EE cause that in the reception electrode EE a current flows, which may be supervised as well as evaluated by an evaluation electronics. This current is indicative for an approach, for example of a hand, to the first electrode structure or for a touch by a hand of the first electrode structure. In the absence of a hand, i.e. when no hands approach to the first electrode structure or when the first electrode structure is not touched by a hand, the current flowing in the reception electrode EE presents a level, which lies below a predetermined switching level. Only by a sufficient approach of an object, for example of a hand, to the first electrode structure the current flowing in the reception electrode EE exceeds the predetermined switching level, so that an approach to the first electrode structure is detected.

The transmitting electrode SE, the compensation electrode KE and the reception electrode EE of the first electrode structure may be arranged at a hand-held device in such a way that instead of an approach to the first electrode structure a touch the first electrode structure is detected. Such an electrode arrangement at a hand-held device is described in more detail in regard to FIG. 9.

As already explained, the field sensing electrodes FE of the second electrode structure are arranged relatively to the first electrode structure in such a way that the alternating electric field WK emitted by the compensation electrode KE of the first electrode structure is not coupled into the field sensing electrodes FE of the second electrode structure. In order to ensure this, the alternating electrical signal supplied to the compensation electrode KE may also be set in such a way that the alternating electric field WK emitted at the compensation electrode KE is sufficiently small, so that it does not couple into the field sensing electrodes FE of the second electrode structure.

In an example of application of the sensor device according to various embodiments, the field sensing electrodes FE of the second electrode structure may be provided, in order to detect simultaneously to a touch of the first electrode structure detected by the first electrode structure also an approach or a touch with the second electrode structure. For this purpose it is sufficient that the field sensing electrodes FE comprise a smaller surface than the reception electrode EE of the first electrode structure.

The alternating electric field WS emitted at the transmitting electrode SE by the first electrode structure may be coupled into the field sensing electrodes FE of the second electrode structure. In the absence of a hand in the observation area between the first electrode structure and the second electrode structure this capacitative coupling is however very small or insignificantly small. The alternating electric field WS coupled at the field sensing electrodes FE cause that in the field sensing electrodes FE an electric current flows, which may be detected or evaluated with an evaluating device. For this electric current flowing in the field sensing electrodes FE also a signal level may be defined, in which an exceeding of this signal level is indicative for an approach of an object to the field sensing electrodes FE.

The use of the sensor device according to various embodiments or the electrode arrangement according to various embodiments may be particularly advantageous to detect simultaneously to an encompassing of a hand-held device by a hand also an approach to the handheld device by a second hand.

Figure 2:
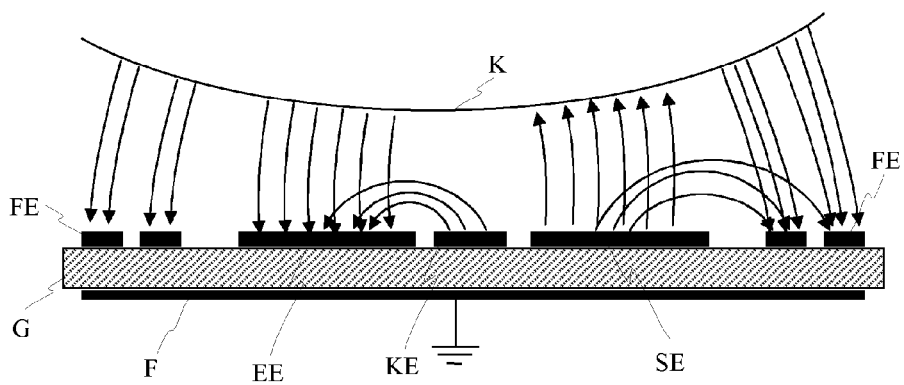
FIG. 2 the electrode arrangement according to various embodiments from FIG. 1 as well as the effect of a body approaching to the electrode arrangement on the field lines of the capacitive near field.

FIG. 2 shows the electrode arrangement represented in FIG. 1, in which the field lines among the single electrodes are influenced by a body K. The body K may be for example a hand approaching to the electrode arrangement.

While a hand is approaching to the first electrode structure KE, the coupling between the transmission electrode SE and the reception electrode EE is increasingly better, because the alternating electric field WS emitted at the transmitting electrode SE is partially coupled through the approaching hand K into the reception electrode EE and thus evade the sphere of action of the alternating electric field WK emitted at the compensation electrode KE. This increasingly better coupling between the transmitting electrode SE and the reception electrode FE cause the level of the current flowing in the reception electrode to be significantly enlarged. As shown in FIG. 2, the approaching hand K acts almost as a bridging of the compensation electrode KE.

The distance between the transmitting electrode on the one hand and the reception electrode or compensation electrode on the other hand can be selected in such a way that the bridging effect between the transmitting electrode SE and the reception electrode EE may not be produced with a single finger. Such an arrangement is described in more detail in regard to FIG. 9. In a corresponding arrangement of the transmitting electrode relatively to the reception electrode at a hand-held device for example the encompass of the hand-held device may be thus reliably detected.

As it may be distinguished from FIG. 2, in a body K approaching to the electrodes also the coupling between the transmitting electrode SE of the first electrode structure and the field sensing electrode FE of the second electrode structure is increased. An electric current flows from a certain approach of the body K in the field electrodes, which current exceeds a predetermined level. The exceeding of this level may be used as indication for the approach of an object, for example of a hand to the field sensing electrodes and to the transmitting electrode SE.

In a corresponding arrangement of the first and the second electrode structure at a hand-held device, the encompass of the hand-held device by a hand and the approach of an object, for example a second hand, at the hand-held device may be in this way reliably detected. The electrodes of the first electrode structure may be arranged at the hand-held device in such a way that the transmitting electrode SE and the reception electrode FE, in case of an encompassing by a hand, are at least partially covered by the hand. The field sensing electrodes of the second electrode structure may be arranged at the hand-held device in such a way that they are not covered by the hand seizing the hand-held device. Thus it may be reliably detected whether the second hand approaches to a hand-held device already encompassed by a hand.

Figure 3:
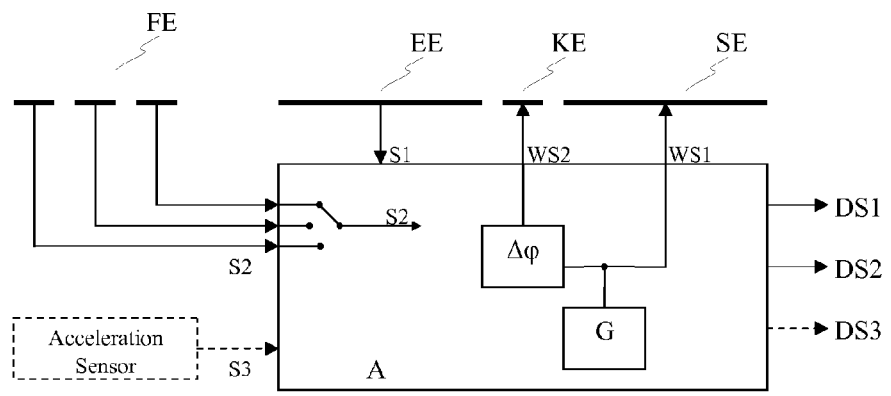
FIG. 3 a block scheme of a possible embodiment of the sensor device according to various embodiments.

FIG. 3 shows a block scheme of a sensor device according to various embodiments. The first electrode structure and the second electrode structure are coupled each time with an evaluating device. The field sensing electrodes FE of the second electrode structure are coupled with the evaluating device in such a way that an electrical signal S2 at the evaluating device is fed to the respective field sensing electrodes.

The reception electrode FE of the first electrode structure is also coupled with the evaluating device in such a way that an electrical signal S1 detected at the reception electrode FE is fed to the evaluating device.

The compensation electrode KE and the transmitting electrode SE of the first electrode structure are supplied by the evaluating device each time with an alternating electrical signal WS2 or WS1. Preferably the alternating electrical signal WS1 is dephased to the alternating electrical signal WS2. The evaluating device may provide for this purpose a signal generator G, for the generation and provision of an alternating electrical signal. The alternating signal provided from the signal generator G may be directly supplied at the transmitting electrode SE. For the charging of the compensation electrode KE with an alternating electrical signal, the signal provided by the signal generator may be fed to the compensation electrode KE through a phase shifter $\Delta\phi$.

The evaluating device is configured in such a way that it may measure and evaluate the electric signal S1 at the reception electrode FE and at least one electrical signal S2 of the field sensing electrodes FE. As a result of this evaluation, the evaluating device may provide a first detection signal DS1 and/or a second detection signal DS2. The detection signals DS1, DS2 provided by the evaluating device contain information of whether an object lies in the observation area of the first electrode structure and/or in the observation area of the second electrode structure. The detection signals may be fed for example to a control device of an electric hand-held device, which depending on the information contained in the detection signals DS1, DS2 may control the electric hand-held device accordingly.

Preferably the evaluating device A is formed in such a way that it may separately measure and evaluate the electric signals S2 at the field sensing electrodes FE for every field sensing electrode. It has the advantage that a number of field sensing electrodes for example at a hand-held device may be arranged at different places, so that on the basis of the electric signals S2 detected by the field sensing electrodes it may be determined to which field sensing electrode FE a hand or a finger approaches. In case of appropriate arrangement of the field sensing electrodes, for example at the upper side of a hand-held device, also the shape of an object approaching to the field sensing electrodes may be contactless and with a good precision determined.

In one embodiment of the sensor device according to various embodiments, the electric signals S2 detected at the field sensing electrodes FE may be evaluated for example in a time-division multiplexing temporally in succession, like it may be seen in FIG. 3.

In addition to the electrodes of the sensor device according to various embodiments, still further sensors may be connected to the evaluating device A. For example an acceleration sensor may be provided, which sensor signal S3 may be conducted to the evaluating device A. The evaluating device A may be so advantageously configured that depending on the electric signals S1 and/or S2, which are detected at the reception electrode FE or at the field sensing electrodes FE, and the sensor signal S3 provided by the accelerating sensor, it provides a detection signal DS3, which contains information of for example how a hand-held device is touched and how the hand-held device is then oriented.

Alternatively another sensor, for example the acceleration sensor may also be fed to a further evaluating device, which is not shown here, to which the detector signals DS1 and DS2 are also fed. The further evaluation of the detector signals DS1, DS2 as well as of the sensor signal S3 of the acceleration sensor may undertake then this further evaluating device not shown here.

Figure 4:
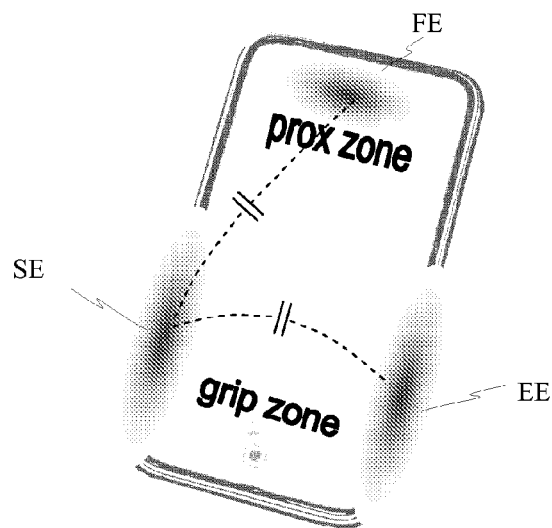
FIG. 4 an arrangement of the electrodes of a sensor device according to various embodiments at an electric hand-held device.

FIG. 4 shows an example of an arrangement of the electrodes of a sensor device according to various embodiments at an electric hand-held device, for example a mobile phone. In the lower area of the hand-held device arranged are the transmitting electrode SE at the left edge zone and the reception electrode EE and the compensation electrode KE of the first electrode structure at the right edge zone. If the lower area of the electric hand-held device is touched by a hand, the transmitting electrode SE and the reception electrode EE will be at least partially covered by the hand. The encompassing by a hand of the hand-held device leads to a significant enlargement of the capacitive coupling between the transmitting electrode SE and the reception electrode EE, which has an effect on the current flowing through the reception electrode EE. The mode of operation has been already described in more detail in regard to FIG. 2.

In the upper area of the electric hand-held device, a field sensing electrode FE of the second electrode structure is arranged. The field sensing electrode FE is arranged in such a way that in case of an encompassing of the hand-held device by a hand the capacitive coupling between the transmitting electrode SE and the field sensing electrode FE is not considerably influenced or considerably improved.

If a second hand approaches now to the field sensing electrode FE, also the capacitive coupling between the transmitting electrode SE and the field sensing electrode FE is significantly improved, which again has an effect on the current flowing through the field sensing electrode FE.

The lower area of the hand-held device is denoted here as "Grip-Zone", the upper area of the hand-held device is denoted as "Prox-Zone". A possible usage scenario of the electrode arrangement shown in FIG. 4 consists in the fact that in a mobile phone the encompassing of the mobile phone by a hand and the approach of the mobile phone to an ear of the user may be detected.

The encompassing of the mobile phone is detected with the help of the transmitting electrode SE and the reception electrode EE of the first electrode structure. The approach to an ear is detected by the field sensing electrode FE. By an approach of the mobile phone to the ear the capacitive coupling between the transmitting electrode SE and the field sensing electrode FE through the body of the user will be constantly greater, up to a certain distance of the field sensing electrode FE to the ear where the capacitive coupling becomes so great that the current flowing through the field sensing electrode FE exceeds a predetermined level.

The detecting signals provided by the evaluating device may be then used for example in such a way that in case of an entering call the ringing signal is stopped as soon as the mobile phone is encompassed by a hand and that the display lighting of the mobile phone is automatically turned off as soon as the mobile phone is held to the ear. Likewise by the encompassing of the mobile phone or as soon as the mobile phone is held to the ear an entering call may be automatically taken. Thus no keys must be operated to take an entering call. Thus the ergonomics and the ease of use are clearly improved by the sensor device according to various embodiments.

Figure 5:
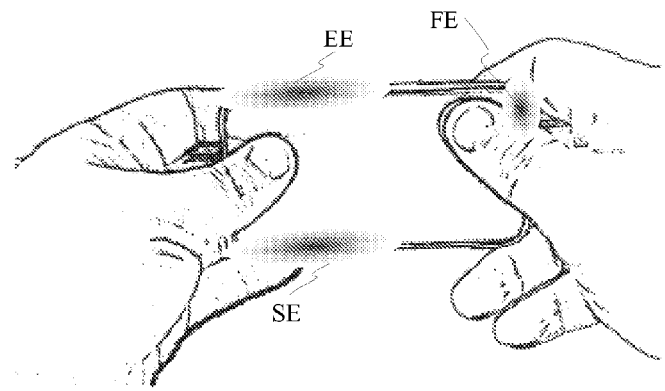
FIG. 5 an example of an application for an evaluation of several detection signals of a sensor device according to various embodiments in an electric hand-held device.

FIG. 5 shows another usage scenario of a sensor device according to various embodiments in a hand-held device. The electrodes of the first electrode structure and the second electrode structure are here substantially arranged in such a way, as it is already shown in regard to FIG. 4. In addition to the detecting signals provided by the sensor device according to various embodiments, also the situation of the mobile phone is here evaluated. If the mobile phone is touched by a hand in the lower area and in the upper area and the mobile phone is situated in a substantially horizontal orientation, the mobile phone for example may automatically switch over into a camera mode. The position of the mobile phone may be determined for example with an acceleration sensor.

Figures 6A, 6B:
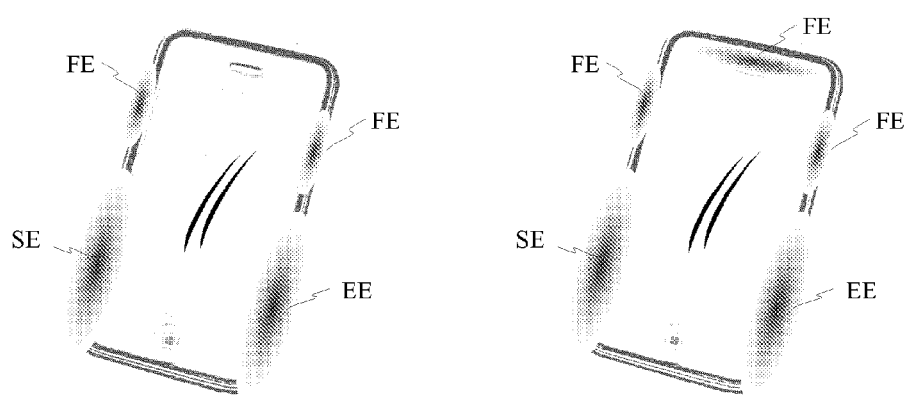
FIG. 6a, b examples for an arrangement of the electrodes of a sensor device according to various embodiments at an electric hand-held device with two field sensing electrodes or three field sensing electrodes.

FIG. 6a and FIG. 6b show two more examples for the arrangement of the electrodes of a sensor device according to various embodiments. In FIG. 6a the transmitting electrode SE and the reception electrode EE are arranged in the lower area of the hand-held device. In the upper area of the hand-held device each time one field sensing electrode FE at both sides is arranged.

In this example the field sensing electrodes FE may be used as a replacement for conventional mechanical sensing device or switch. For example the field sensing electrodes FE or the detection signal assigned to the field sensing electrodes FE may be linked with a telephone book function of a mobile phone. If a user encompasses the mobile phone with a hand and he/she approaches for example with the thumb to the right or the left field sensing electrode FE, the mobile phone may be automatically switched over into a telephone book mode.

Instead of the right field sensing electrode a conventional sensing device may also be provided, which is for a right-hander simple to handle. The left field sensing electrode may have the same function as the sensing device arranged on the right, but the left field sensing electrode is for a left-hander more simple to handle. Depending on the operation a right-/left-hander distinction may be then realized in a simple way. Together with the embodiment shown in FIGS. 7 and 8 a field sensing electrode may be provided for instance at the left, with which a sensing device may be "simulated", i.e. the function assigned to the left field sensing electrode is not activated only by an approach, but only when the surface of the hand-held device is touched, so that an accordingly faster signal level rise is measurable (see FIGS. 7 and 8).

Together with the example of application, like it has been described in regard to FIG. 5, both these field sensing electrodes FE may be also used as trigger while the camera mode is on. A suitable arrangement of the field sensing electrodes FE for this purpose is shown in regard to FIG. 6b.

In the arrangement of the field sensing electrodes FE shown in FIG. 6b the electric signals S2 of the field sensing electrodes FE may be also used for example in order to further increase the detecting precision for the acceptance of a call at a mobile phone. This may be reached for example by providing an electrical signal from at least two field sensing electrodes FE, which exceed a predetermined level.

The sensor device shown and described here may be also used in a hand-held device, for example a mobile phone, for switching over from a first mode of operation into a second mode of operation. The first mode of operation may be for example a sleeping mode, the second mode of operation may be an active mode. In this way the energy consumption of a mobile phone may be clearly reduced, in that the mobile phone is in an active mode only when it is in fact encompassed by a hand or is in use.

In another usage scenario the sensor device according to various embodiments may be also arranged for example in a computer mouse. The electrodes of the first electrode structure may be arranged at the computer mouse in such a way that an encompassing of the computer mouse is detected. The field sensing electrodes of the second electrode structure may be provided for example to define approaching areas for a left mouse button and for a right mouse button. If the computer mouse is not encompassed by a hand, the computer mouse may switch over to a sleeping mode. Because of the necessary capacitive coupling between the transmitting electrode and the field sensing electrodes it may also be avoided that a computer mouse is switched over to an active mode by only approaching to one of the two field sensing electrodes, without also being encompassed at the same time by the hand.

In a further usage scenario a video camera (camcorder) may be equipped with the sensor device according to various embodiments. So the first electrode structure may be arranged for example in the area of the camera loop, into which the hand is introduced for the encompassing of the camera. In this way it may be detected that the hand lies in the loop. In one embodiment of various embodiments a starting sequence of the camera or the camcorder can be started, as soon as the hand lies in the loop. In this way the time lapse for starting a video recording may be considerably shortened. Furthermore the camera system may be formed in such a way that in the removing of the hand from the loop, for example, if the camcorder is stopped, at least the display of the camcorder is switched off.

In a further embodiment one or several field sensing electrodes FE may be arranged at the video camera, with which different actions may be caused at the video camera when a finger approaches near enough to a corresponding field sensing electrode. Preferably such actions are releasable by means of the field sensing electrodes at the video camera, which must only occur when the hand lies at the loop of the video camera.

Figure 7:
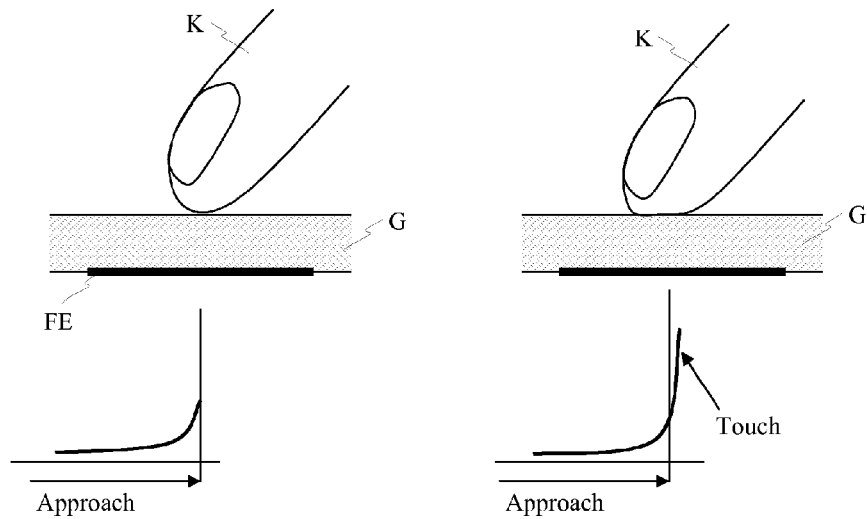
FIG. 7 two signal curves at a field sensing electrode once in case of one finger approaching to the field sensing electrode and once in case of one finger touching the surface of the field sensing electrode.

FIG. 7 shows a signal curve of the electric signal tapped from a field sensing electrode FE by an approach to for example a case of a hand-held device and by touching the case. The field sensing electrode FE here is not arranged at the outer side of the case G, but at the inner side of the case G. Thus the field sensing electrode is on the one hand protected from outer influences and on the other hand the field sensing electrode does not influence the design of the case.

If a finger approaches to the case in the area in which a field sensing electrode FE is arranged, the level of the electric signal at the field sensing electrode FE increases continually, like it is shown at the left side of FIG. 7. If the finger K touches the surface of the case G, the coupling surface of the finger is abrupt enlarged, so that also the capacitative coupling between the transmission electrode SE and the corresponding field electrode FE grows abruptly. This abrupt growth of the capacitive coupling causes in turn that also the electric current detected at the field sensing electrode FE grows abruptly. This abrupt level rise of the signal detected at the field sensing electrode FE may be used in order to distinguish an approach to the field sensing electrode FE from a touch with the field electrode FE.

Figure 8:
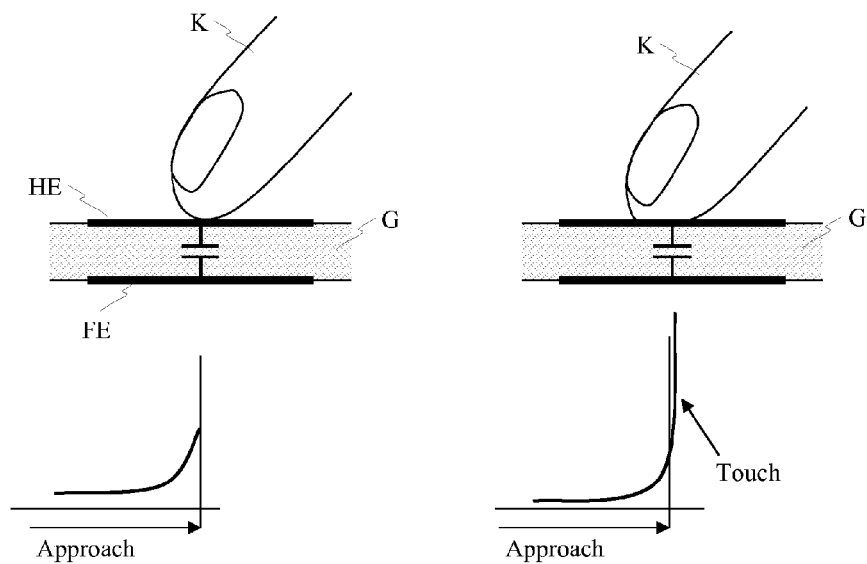
FIG. 8 the signal curves from FIG. 7, but in a field sensing electrode, which is assigned to an auxiliary electrode.

In order to bring a field sensing electrode FE arranged into the inner side of the case G still better into a capacitative coupling to an approaching finger, at the case exterior or directly below the surface of the case exterior an auxiliary electrode HE may be arranged. Such an arrangement is shown in FIG. 8.

The auxiliary electrode HE thereby is brought in reference to the field sensing electrode FE arranged at the case inner side. This may be done by means of a galvanic connection between the auxiliary electrode HE and the field sensing electrode FE. The galvanic connection has the advantage that the auxiliary electrode HE must not be arranged directly opposite to the field sensing electrode FE. In another embodiment the coupling of the auxiliary electrode HE with the field sensing electrode FE may also take place on a capacitive basis, as shown in FIG. 8. The capacitative coupling has the advantage, that at the housing G no openings must be provided, in order to couple the field sensing electrode FE with the auxiliary electrode HE.

Compared to the signals shown in FIG. 7 or signal curves the signal levels of the signals detected at the field sensing electrode FE in case of a approaching finger are greater, because the auxiliary electrode HE achieves a better capacitative coupling between the field sensing electrode FE and the approaching finger. Likewise by touching the auxiliary electrode HE by a finger K a stronger effect on the signal level of the signal detected at the field sensing electrode FE is achieved, since between finger and field sensing electrode FE no cases working as dielectric are present. The abruptly amplifying coupling surface of the finger leads therefore to a still greater level rise of the signal detected at the field sensing electrode FE. Thus, a more precise distinction between an approach and a touch may take place.

The distinction between an approach and a touch may be provided in order to cause for example a focusing of the camera by approaching to a field sensing electrode (see FIG. 5) and a picture-taking by touching the field sensing electrode.

Figure 9:
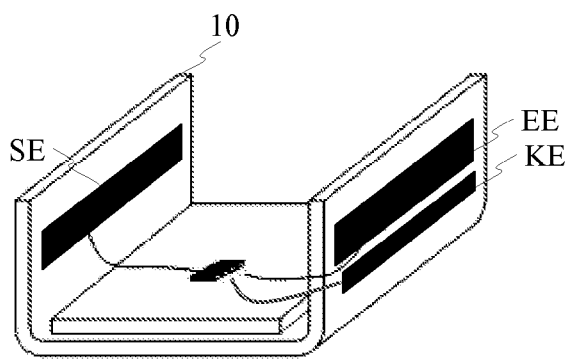
FIG. 9 the arrangement of the electrodes for a detection of an encompassing at a hand-held device.

In FIG. 9 the arrangement of the electrodes of the first electrode structure at a hand-held device is symbolically shown. At the left side of the hand-held device, arranged is the transmitting electrode SE. At the right side of the hand-held device, arranged are the compensation electrode ICE and the reception electrode EE, wherein the reception electrode EE is arranged over the compensation electrode KE.

In this way it is possible to detect an encompassing of a hand-held device with particular advantage, whereas the detection of only an approach to the hand-held device is efficiently avoided.

In a further embodiment, not shown here, of the sensor device according to various embodiments the first electrode structure may also have several transmission electrodes, several compensation electrodes and/or several reception electrodes. Likewise the sensor device may also include several first electrode structures, so that for example at a hand-held device, when several first electrode structures are arranged at a hand-held device, the encompassing of the hand-held device may be detected at different areas of the hand-held device. Alternatively it may also be detected whether the hand-held device is encompassed or comprised by two hands.

The hand-held device may be for example a mobile phone, a computer mouse, a remote control, an input means for a games console, a movable minicomputer (PDA), a headphone, hearing aid, or the like. The sensor device according to various embodiments may also be provided for larger electrical appliances, by which it is for example necessary to detect a touch of the device and at the same time an approach to the device. The sensor device according to various embodiments may also be operated in such a way that the electric signals detected at the first electrode structure arc evaluated independently of the electric signals detected at the second electrode structure.

What is claimed is:

1. Sensor device, comprising
   at least one first electrode structure, wherein the first electrode structure comprises at least one transmitting electrode and at least one reception electrode, wherein the at least one reception electrode is capacitively coupled with the at least one transmitting electrode,
   at least one second electrode structure, wherein the second electrode structure comprises at least one field sensing electrode, wherein the at least one field sensing electrode is capacitively coupled with the at least one transmitting electrode of the at least one first electrode structure, and
   an evaluating device, which is coupled with the first electrode structure and the second electrode structure, wherein the transmitting electrode is supplied with a first alternating electrical signal and wherein the evaluating device is configured to evaluate a first electrical signal tapped from the reception electrode and a second electrical signal tapped from the at least one field sensing electrode.

2. Sensor device according to claim 1, wherein the first electrode structure comprises at least one compensation electrode, wherein the at least one reception electrode is capacitively coupled with the at least one compensation electrode, and wherein the at least one compensation electrode is supplied with a second alternating electrical signal.

3. Sensor device according to claim 1, wherein the evaluating device comprises a signal generator device for providing the first alternating electrical signal and the second alternating electrical signal.

4. Sensor device according to claim 2, wherein the reception electrode, the transmitting electrode, the compensation electrode and the field sensing electrodes are arranged in relation to each other in such a way that
   a first alternating electrical field emitted by the transmitting electrode is coupled into the reception electrode and into at least one of the field sensing electrodes, and
   a second alternating electrical field emitted by the compensation electrode is coupled substantially only into the reception electrode.

5. Sensor device according to claim 1, wherein at least one of the field sensing electrodes is assigned to an auxiliary electrode, wherein the auxiliary electrode is galvanically or capacitively coupled with the at least one field sensing electrode.

6. Sensor device according to claim 5, wherein a contact to the auxiliary electrode by an object, in case of a simultaneous approach of the object to the first electrode structure, leads to an abrupt change of the level of the second electric signal tapped from the field sensing electrode assigned to the auxiliary electrode.

7. Sensor device according to claim 1, wherein the sensor device is configured
   to tap a first electrical signal from the reception electrode and to evaluate its signal level,
   to tap a second electrical signal from the at least one field sensing electrode and to evaluate its signal level,
   wherein the results of the evaluation of the signal levels of the first electric signal and of the second electric signal being used in order to transfer an electric hand-held device into a operating mode depending on the signal levels.

8. Sensor device according to claim 2, wherein the compensation electrode is arranged between the transmitting electrode and the reception electrode.

9. Sensor device according to claim 2, wherein the electrodes are arranged in relation to each other in such a way that the behaviour of the electric field lines among the electrodes is influenced by a body.

10. Sensor device according to claim 2, wherein the electrodes of the first electrode structure are arranged in relation to each other in such a way that a body approaching to the electrodes of the first electrode structure bridges the second alternating electric field emitted at the compensation electrode, whereby the first alternating electric field emitted at the transmitting electrode is coupled over the body into the reception electrode.

11. Sensor device according to claim 2, wherein the second electric signal is tapped in a multiplexing method, preferably in a time-division multiplexing method from the at least one field sensing electrode.

12. Sensor device according to claim 2, wherein the first alternating electrical signal and the second alternating electrical signal are dephased to each other.

13. Sensor device according to claim 2, wherein the amplitude of the first alternating electrical signal is greater than the amplitude of the second alternating electrical signal.

14. Sensor device according to claim 1, wherein the transmitting electrode and the reception electrode are arranged at a hand-held device in relation to each other in such a way that in case of an encompassing of the hand-held device by a hand they are at least partially covered by the same.

15. Sensor device according to claim 1, wherein the sensor device is coupled with a sensor, which is not formed as a capacitive sensor, and wherein a sensor signal of the sensor is fed to the evaluating device.

16. Sensor device according to claim 15, wherein the sensor comprises an acceleration sensor.

17. Sensor device, comprising
   at least one first electrode structure and at least one second electrode structure, wherein the first electrode structure comprises a transmitting electrode, a compensation electrode and a reception electrode and wherein the second electrode structure comprises a number of field sensing electrodes, and
   an evaluating device, which is coupled with the first electrode structure and the second electrode structure, wherein the evaluating device comprises a signal generator device for supplying the transmitting electrode with a first alternating electrical signal and for supplying the compensation electrode with a second alternating electrical signal, and wherein the evaluating device is configured to evaluate a first electrical signal tapped from the reception electrode and at least one second electrical signal tapped from the field sensing electrodes,
   wherein the reception electrode, the transmitting electrode, the compensation electrode and the field sensing electrodes being arranged in relation to each other in such a way that a first alternating electrical field emitted by the transmitting electrode being coupled into the reception electrode and into at least one of the field sensing electrodes, and a second alternating electrical field emitted by the compensation electrode being coupled substantially only into the reception electrode.

18. Sensor device according to claim 17, wherein an approach of an object to the first electrode structure leads to a change of a level of the first electric signal tapped from the reception electrode, wherein the change of the level is indicative for an approach of an object to the first electrode structure.

19. Sensor device according to claim 18, wherein an additional approach of the object to the second electrode structure leads to a change of a level of at least one second electric signal tapped from the field sensing electrodes, wherein the level change of the second electric signal is indicative for the fact that the object approaches to both the first electrode structure and the second electrode structure.

20. Sensor device according to claim 17, wherein an auxiliary electrode is assigned to at least one of the field sensing electrodes, the auxiliary electrode being galvanically or capacitively coupled with the at least one field sensing electrode.

21. Sensor device according to claim 20, wherein a contact to the auxiliary electrode by an object, by a simultaneous approach of the object to the first electrode structure, leads to an abrupt change of the level of the second electric signal tapped from the field sensing electrode assigned to the auxiliar electrode.

22. Sensor device according to claim 17, wherein the transmitting electrode and the reception electrode being arranged at a hand-held device in relation to each other in such a way that in case of an encompassing of the hand-held device by a hand they are at least partially covered by the same.

23. Sensor device according to claim 17, wherein the first alternating electrical signal and the second alternating electrical signal are dephased to each other.

24. Sensor device according to claim 17, wherein the amplitude of the first alternating electrical signal is greater than the amplitude of the second alternating electrical signal.

25. Sensor device according to claim 17, wherein the sensor device is coupled with a sensor, which is not formed as a capacitive sensor, and wherein a sensor signal of the sensor is fed to the evaluating device.

26. Sensor device according to claim 25, wherein the sensor comprises an acceleration sensor.

27. Hand-held device with a sensor device comprising at least one first electrode structure, wherein the first electrode structure comprises at least one transmitting electrode and at least one reception electrode, wherein the at least one reception electrode is capacitively coupled with the at least one transmitting electrode, at least one second electrode structure, wherein the second electrode structure comprises at least one field sensing electrode, wherein the at least one field sensing electrode is capacitively coupled with the at least one transmitting electrode of the at least one first electrode structure, and an evaluating device, which is coupled with the first electrode structure and the second electrode structure, wherein the transmitting electrode is supplied with a first alternating electrical signal and wherein the evaluating device is configured to evaluate a first electrical signal tapped from the reception electrode and a second electrical signal tapped from the at least one field sensing electrode.

28. Hand-held device according to claim 27, wherein the transmitting electrode and the reception electrode of the sensor device are arranged on the handheld device in such a way that in case of encompassing of the hand-held device by a hand they are at least partially covered by the hand.

29. Hand-held device according to claim 27, wherein the hand-held device is at least one of mobile phone, computer mouse, remote control, input means for a games console, mobile minicomputer, headphone, and hearing aid.

30. Method for the detection of an encompassing of a hand-held device by a user in case of a simultaneous detection of an approach of the user to the hand-held device with a sensor device, which comprises at least one first electrode structure and at least one second electrode structure, wherein the first electrode structure comprises a transmitting electrode, a compensation electrode and a reception electrode and wherein the second electrode structure comprises a number of field sensing electrodes, the method comprising supplying the transmitting electrode with a first alternating electrical signal and the compensation electrode with a second alternating electrical signal in such a way that a first alternating electrical field is emitted at the transmitting electrode, which is coupled into the reception electrode and into at least one of the field sensing electrodes, and a second alternating electrical field is emitted at the compensation electrode, which is coupled substantially only into the reception electrode, tapping a first electrical signal from the reception electrode and evaluating a signal level of the first electrical signal, wherein the signal level of the first electric signal is indicative for the encompassing of the hand-held device by a user, and tapping a second electrical signal from at least one of the field sensing electrodes and evaluating a signal level of the second electrical signal, wherein the signal level of the second electric signal) is indicative for the approaching of the user to the hand-held device.

31. Method according to claim 28, wherein the results of the evaluations of the signal level of the first electric signal and of the second electric signal are used in order to transfer the hand-held device into an operating mode depending on the signal levels.

32. Hand-held device with a sensor device comprising:

at least one first electrode structure and at least one second electrode structure, wherein the first electrode structure comprises a transmitting electrode, a compensation electrode and a reception electrode and wherein the second electrode structure comprises a number of field sensing electrodes, and an evaluating device, which is coupled with the first electrode structure and the second electrode structure, wherein the evaluating device comprises a signal generator device for supplying the transmitting electrode with a first alternating electrical signal and for supplying the compensation electrode with a second alternating electrical signal, and wherein the evaluating device is configured to evaluate a first electrical signal tapped from the reception electrode and at least one second electrical signal tapped from the field sensing electrodes, wherein the reception electrode, the transmitting electrode, the compensation electrode and the field sensing electrodes being arranged in relation to each other in such a way that a first alternating electrical field emitted by the transmitting electrode being coupled into the reception electrode and into at least one of the field sensing electrodes, and a second alternating electrical field emitted by the compensation electrode being coupled substantially only into the reception electrode.

33. Hand-held device according to claim 32, wherein the transmitting electrode and the reception electrode of the sensor device are arranged on the handheld device in such a way that in case of encompassing of the hand-held device by a hand they are at least partially covered by the hand.

34. Hand-held device according to claim 33, wherein the hand-held device is at least one of mobile phone, computer mouse, remote control, input means for a games console, mobile minicomputer, headphone, and hearing aid.

* * * * *